(12) United States Patent
Zhou

(10) Patent No.: US 12,040,809 B2
(45) Date of Patent: Jul. 16, 2024

(54) DIGITAL TO ANALOG CONVERTER CIRCUIT AND CURRENT STEERING DIGITAL TO ANALOG CONVERTER

(71) Applicant: REALTEK SEMICONDUCTOR CORPORATION, Hsinchu (TW)

(72) Inventor: Xiao-Bo Zhou, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 163 days.

(21) Appl. No.: 17/730,248

(22) Filed: Apr. 27, 2022

(65) Prior Publication Data

US 2023/0024327 A1      Jan. 26, 2023

(30) Foreign Application Priority Data

Jul. 23, 2021   (CN) .......................... 202110836013.2

(51) Int. Cl.
*H03M 1/06*    (2006.01)
(52) U.S. Cl.
CPC ................................. *H03M 1/0604* (2013.01)
(58) Field of Classification Search
CPC .............................. H03M 1/0614; H03M 1/12
USPC ................................. 341/118, 120, 172, 144
See application file for complete search history.

(56) References Cited

U.S. PATENT DOCUMENTS

| 4,188,588 | A  | * | 2/1980 | Dingwall | ............ | H03F 3/45179 |
| | | | | | | 330/253 |
| 7,907,972 | B2 | * | 3/2011 | Walton | .................. | H04W 16/00 |
| | | | | | | 455/562.1 |
| 10,944,417 | B1 | | 3/2021 | Lahiri | | |
| 2014/0253211 | A1 | * | 9/2014 | Lnu | .......................... | H03L 5/00 |
| | | | | | | 327/333 |

FOREIGN PATENT DOCUMENTS

CN          113055008 A       6/2021

OTHER PUBLICATIONS

P. Palmers and M. S. J. Steyaert, "A 10-Bit 1.6-GS/s 27-mW Current-Steering D/A Converter With 550-MHz 54-dB SFDR Bandwidth in 130-nm CMOS," in IEEE Transactions on Circuits and Systems I: Regular Papers, vol. 57, No. 11, pp. 2870-2879, Nov. 2010, doi: 10.1109/TCSI.2010.2052491.
C. -H. Lin et al., "A 12 bit 2.9 GS/s DAC with IM3 < - 60 dBc beyond 1 GHz in 65 nm CMOS," in IEEE Journal of Solid-State Circuits, vol. 44, No. 12, pp. 3285-3293, Dec. 2009, doi: 10.1109/JSSC.2009.2032624.

(Continued)

*Primary Examiner* — Peguy Jean Pierre
(74) *Attorney, Agent, or Firm* — WPAT, P.C

(57) ABSTRACT

An analog to digital convertor circuit includes an input circuit and a switched capacitor circuit. The input circuit is configured to selectively drain a first current from a first node or drain a second current from a second node according to a first bit and a second bit that have opposite logic values. The switched capacitor circuit is configured to compensate a capacitance value of one of the first node and the second node according to the first bit and the second bit.

19 Claims, 7 Drawing Sheets

(56) References Cited

OTHER PUBLICATIONS

Y. Tang et al., "A 14 bit 200 MS/s DAC With SFDR >78 dBc, IM3 <-83 dBc and NSD <-163 dBm/Hz Across the Whole Nyquist Band Enabled by Dynamic-Mismatch Mapping," in IEEE Journal of Solid-State Circuits, vol. 46, No. 6, pp. 1371-1381, Jun. 2011, doi: 10.1109/JSSC.2011.2126410.

X. Li, Q. Wei, Z. Xu, J. Liu, H. Wang and H. Yang, "A 14 Bit 500 MS/s CMOS DAC Using Complementary Switched Current Sources and Time-Relaxed Interleaving DRRZ," in IEEE Transactions on Circuits and Systems I: Regular Papers, vol. 61, No. 8, pp. 2337-2347, Aug. 2014, doi: 10.1109/TCSI.2014.2332248.

OA letter of the counterpart TW application (U.S. Appl. No. 10/944,417) mailed on Jun. 6, 2022. Summary of the TW OA letter:1. Claims 1-3, 5, and 7-8 are rejected as allegedly being anticipated by (U.S. Pat. No. 10,944,417 B1). 2. Claim 9 is rejected as allegedly being unpatentable over (CN 113055008 A).3. Claims 4, 6, and 10 are allowable.Correspondence between claims of TW counterpart application and claims of US application: 1. Claims 1-8 and 9-10 in TW counterpart application correspond to claims 1-8 and 11-12 in (continued from citation 2 on page 2) in U.S. Application, respectively.

\* cited by examiner

DIGITAL TO ANALOG CONVERTER CIRCUIT AND CURRENT STEERING DIGITAL TO ANALOG CONVERTER

BACKGROUND OF THE INVENTION

1. Field of the Invention

The present disclosure relates to a digital to analog converter circuit, especially to a digital to analog converter circuit and a current steering digital to analog converter that compensate a capacitance value to increase the linearity.

2. Description of Related Art

For a current steering digital to analog converter utilized in a high-speed application, the switching impedance may determine a linearity of the current steering digital to analog converter. In existing approaches, an equivalent impedance of a transistor is directly increased to increase the switching impedance of the digital to analog converter. However, in practical applications, the switching impedance suffers impacts from parasitic components of transistor(s) or wire (s), and thus matching between the equivalent impedances of transistors are poor at high frequencies, which results in a lower linearity of the current steering digital to analog converter.

SUMMARY OF THE INVENTION

In some aspects of the present disclosure, a digital to analog converter circuit includes an input circuit and a switched-capacitor circuit. The input circuit is configured to selectively drain a first current from a first node or drain a second current from a second node according to a first bit and a second bit, in which the first bit and the second bit have opposite logic values. The switched-capacitor circuit is configured to selectively compensate a capacitance value of one of the first node and the second node according to the first bit and the second bit.

In some aspects of the present disclosure, a current steering digital to analog converter includes a load circuit and a plurality of digital to analog converter circuits. The load circuit is configured to convert a first current into a first output signal and convert a second current into a second output signal. The plurality of digital to analog converter circuits are configured to drain the first current and the second current according to a plurality of bits, in which one of the plurality of digital to analog converter circuits includes an input circuit and a switched-capacitor circuit. The input circuit is configured to drain a signal component in the first current from a first node or drain a signal component in the second current from a second node according to a first bit and a second bit in the plurality of bits, in which the first bit is a most significant bit in the plurality of bits, and the first bit and the second bit have opposite logic values. The switched-capacitor circuit is configured to selectively compensate a capacitance value of each of the first node and the second node.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
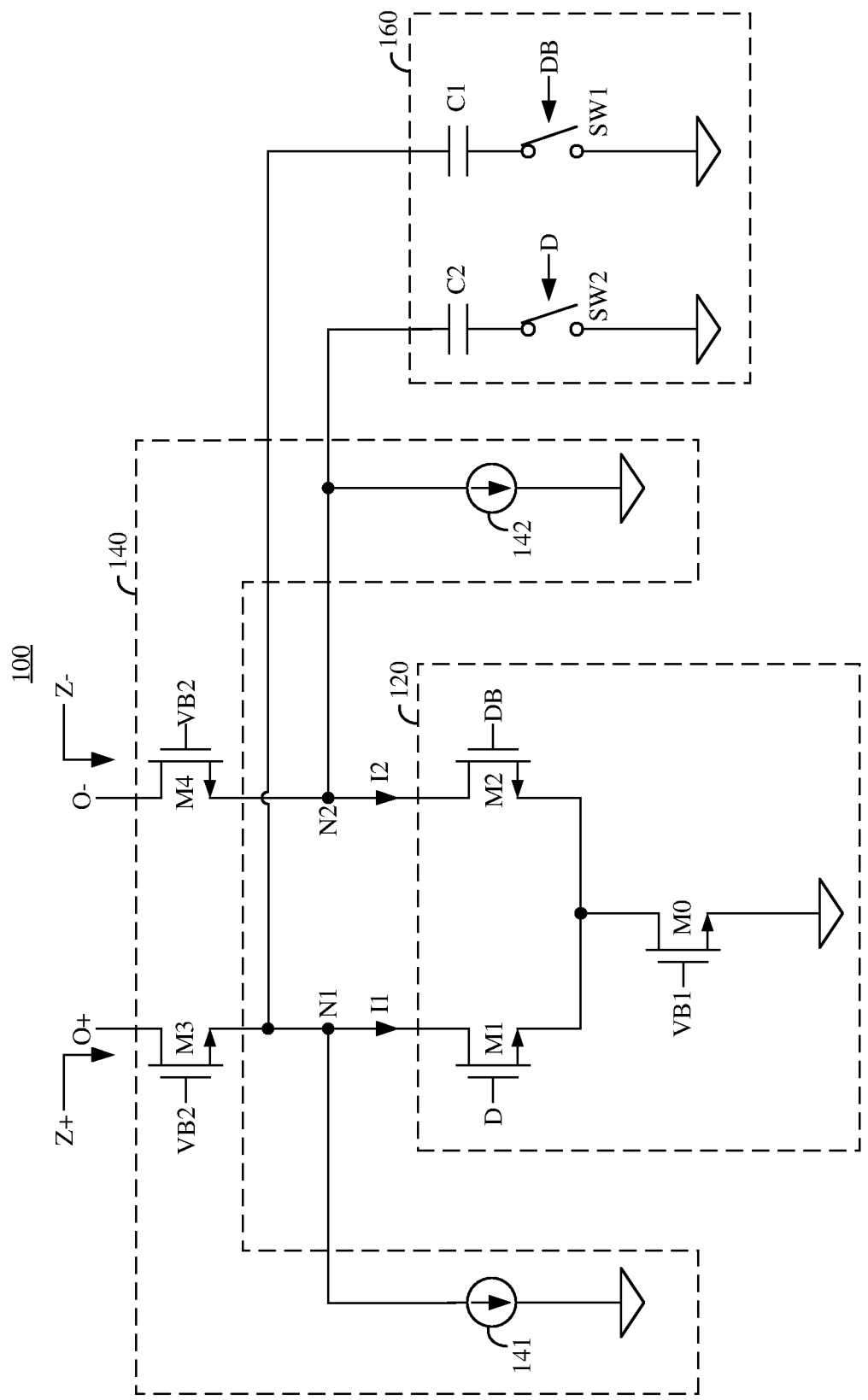
FIG. 1A shows a schematic diagram of a digital to analog converter circuit according to some embodiments of the present disclosure.

FIG. 1A shows a schematic diagram of a digital to analog converter circuit 100 according to some embodiments of the present disclosure. In some embodiments, the digital to analog converter circuit 100 may be a circuit cell for converting a set of corresponding bits in a digital to analog converter (e.g., a digital to analog converter 300A in FIG. 3A).

The digital to analog converter circuit 100 includes an input circuit 120, an impedance adjustment circuit 140, and a switched-capacitor circuit 160. The input circuit 120 is configured to selectively drain a current I1 from a node N1 or drain a current I2 from a node N2 according to a bit D and a bit DB. The bit D and the bit DB have opposite logic values. For example, if the bit D has a logic value of 1, the bit DB has a logic value of 0. Alternatively, if the bit D has the logic value of 0, the bit DB has the logic value of 1.

The input circuit 120 includes the transistor M0-M2. A first terminal of the transistor M1 (e.g., drain) is coupled to the node N1, a second terminal of the transistor M1 (e.g., source) is coupled to a first terminal of the transistor M0, and a control terminal of the transistor M1 (e.g., the bit D) receives the bit D. A first terminal of the transistor M2 is coupled to the node N2, a second terminal of the transistor M2 is coupled to the first terminal of the transistor M0, and a control terminal of the transistor M2 receives the bit DB. A second terminal of the transistor M0 is coupled to ground, and a control terminal of the transistor M0 receives a voltage VB1.

In this example, the transistor M0 may operate as a current source circuit, which is configured to generate a current (e.g., $2^n \times I$ or $2^0 \times I$ in FIG. 3A) according to the voltage VB1, in order to bias the transistor M1 and the transistor M2. The transistor M1 and the transistor M2 may operate as a differential input pair. The transistor M1 is selectively turned on according to the bit D, and the transistor M2 is selectively turned on according to the bit DB. When the transistor M1 is turned on, the transistor M2 is not turned on. Under this condition, the transistor M1 may drain the current I1 from the node N1. Similarly, when the transistor M2 is turned on, the transistor M1 is not turned on. Under this condition, the transistor M2 may drain the current I2 from the node N2.

The impedance adjustment circuit 140 is configured to transmit the current I1 from an output terminal O+ to the node N1 or transmit the current I2 from an output terminal O− to the node N2, and is configured to increase an output impedance Z+ of the output terminal O+ and an output impedance Z− of the output terminal O−. The output impedance Z− and the output impedance Z+ may be utilized to define a switching impedance of the digital to analog converter circuit 100. With circuit analysis and simulation, it can be understood that if the switching impedance is higher, a harmonic distortion of the digital to analog converter circuit 100 is lower, and thus the linearity of the digital to analog converter circuit 100 is higher. With circuit analysis and simulation, it can be known that, in order to increase such switching impedance, the output impedance Z− and the output impedance Z+ can be increased, or the output impedance Z− and the output impedance Z+ can be configured to be matched with each other (i.e., being identical to each other). In some embodiments, the impedance adjustment circuit 140 is configured to increase the output impedance Z+ and the output impedance Z−, and the switched-capacitor circuit 160 is configured to match the output impedance Z+ with the output impedance Z− as much as possible (i.e., decrease a difference between the output impedance Z+ and the output impedance Z− as much as possible).

In greater detail, the impedance adjustment circuit 140 includes a transistor M3, a transistor M4, a current source circuit 141, and a current source circuit 142. A first terminal of the transistor M3 is coupled to the output terminal O+, a second terminal of the transistor M3 is coupled to the node N1, a control terminal of the transistor M3 receives a voltage VB2. A first terminal of the transistor M4 is coupled to the output terminal O−, a second terminal of the transistor M4 is coupled to the node N2, and a control terminal of the transistor M4 receives the voltage VB2. As shown in FIG. 1A, the transistor M3 and the transistor M1 are cascode-connected, and the transistor M4 and the transistor M2 are cascode-connected. As a result, the output impedance Z+ and the output impedance Z− can be increased.

The current source circuit 141 is coupled to the node N1, and is configured to provide a current to bias the transistor M3, in order to keep a work region of the transistor M3. Similarly, the current source circuit 142 is coupled to the node N2, and is configured to provide a current to bias the transistor M4, in order to keep the work region of the transistor M4. In some embodiments, in order to lower the power consumption, a current generated from each of the current source circuit 141 and the current source circuit 142 may be lower than a current generated from the transistor M0, but the present disclosure is not limited thereto. As mentioned above, when one of the transistor M1 and the transistor M2 is turned on, another one of the transistor M1 and the transistor M2 is not turned on. When the transistor M1 is turned on and the transistor M2 is not turned on, the current source circuit 142 may continue biasing the transistor M4 to keep the transistor M4 operating in a predetermined work region (e.g., saturation region). As a result, it can ensure that the output impedance Z− is close to the output impedance Z+, in order to increase the overall linearity. Similarly, when the transistor M2 is turned on and the transistor M1 is not turned on, the current source circuit 141 may continue biasing the transistor M3 to keep the transistor M3 operating in a predetermined work region (e.g., saturation region). As a result, it can ensure that the output impedance Z+ is close to the output impedance Z−.

The switched-capacitor circuit 160 is configured to selectively compensate a capacitance value of the node N1 and the node N2 according to the bit D and the bit DB. In greater detail, the switched-capacitor circuit 160 may increase the capacitance value of the node N1 according to the bit DB, and increase the capacitance value of the node N2 according to the bit D. In this example, the switched-capacitor circuit 160 is configured to selectively couple a capacitor (e.g., capacitor C1) to the node N1 according to the bit DB, and selectively couple a capacitor (e.g., capacitor C2) to the node N2 according to the bit D. In greater detail, the switched-capacitor circuit 160 includes a capacitor C1, a capacitor C2, a switch SW1, and a switch SW2. A terminal of the capacitor C1 is coupled to the node N1, and another terminal of the capacitor C1 is coupled to ground via the switch SW1. The switch SW1 is selectively turned on according to the bit DB. When the switch SW1 is turned on, the node N1 is coupled to ground via the capacitor C1. Similarly, a terminal of the capacitor C2 is coupled to the node N2, and another terminal of the capacitor C2 is coupled to ground via the switch SW2. The switch SW2 is selectively turned on according to the bit D. When the switch SW2 is turned on, the node N2 is coupled to ground via the capacitor C2.

With the above arrangements, the switched-capacitor circuit 160 is able to increase the capacitance value of the node N1 when the transistor M1 is turned off, and increase the capacitance value of the node N2 when the transistor M2 is turned off. For example, when the transistor M1 is turned off according to the bit D, the switch SW1 is turned on according to the bit DB to couple the node N1 to ground via the capacitor C1. As a result, the capacitance value of the node N1 is increased. Similarly, when the transistor M2 is turned off according to the bit DB, the switch SW2 is turned on according to the bit D to couple the node N2 to ground via the capacitor C2. As a result, the capacitance value of the node N2 is increased. Accordingly, the matching of the output impedance Z+ and the output impedance Z− can be further improved, in order to increase the linearity. Arrangements about the switched-capacitor circuit 160 are given with reference to FIG. 1B.

Figure 1B:
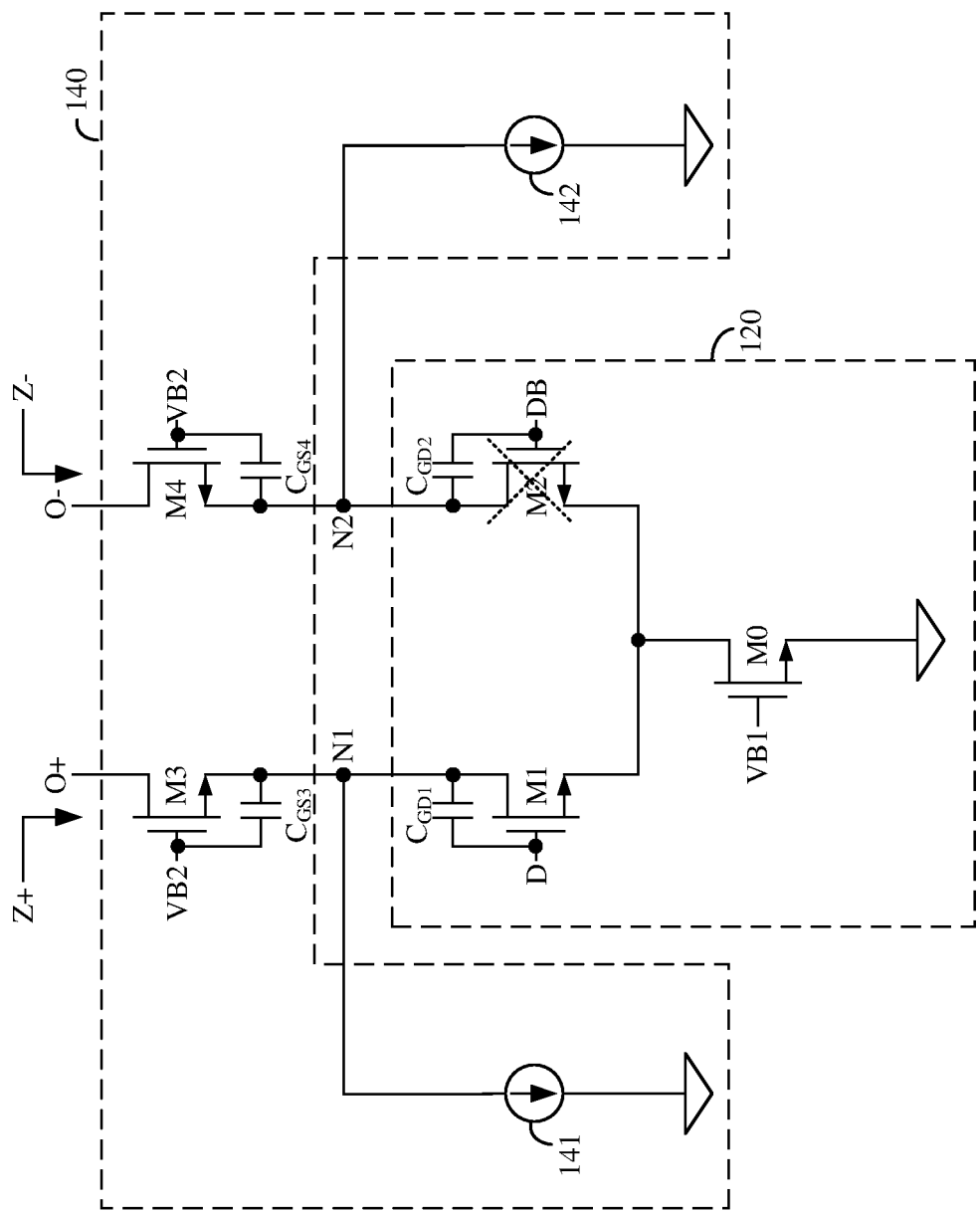
FIG. 1B shows a schematic diagram of the input circuit, the impedance adjustment circuit, and relevant parasitic capacitors in FIG. 1A according to some embodiments of the present disclosure.

FIG. 1B shows a schematic diagram of the input circuit 120, the impedance adjustment circuit 140, and relevant parasitic capacitors in FIG. 1A according to some embodiments of the present disclosure. For ease of understanding, it is assumed that examples in FIG. 1B does not employ the switched-capacitor circuit 160.

In practical applications, because of impacts from parasitic capacitors and work region of transistor(s), the output impedance Z+ and the output impedance Z− may be mismatched, which results in a lower linearity. For example, a capacitor on the node N1 (hereinafter referred to as "capacitor $C_A$") is mainly determined by a parasitic capacitor $C_{GS3}$ of the transistor M3 and a parasitic capacitor $C_{GD1}$ of the transistor M1 (i.e., $C_A = C_{GS3} + C_{GD1}$), a capacitor on the node N2 (hereinafter referred to as "capacitor $C_B$") is mainly determined by a parasitic capacitor $C_{GS4}$ of the transistor M4 and a parasitic capacitor $C_{GD2}$ of the transistor M2 (i.e., $C_B = C_{GS4} + C_{GD2}$). With reference to relevant analysis of parasitic capacitor of transistors (e.g., MOSFET) in an existing document, it can be understood that, the capacitance value of the parasitic capacitor between gate and drain (e.g., the parasitic capacitor $C_{GD1}$ or $C_{GD2}$) is associated with the work region of the transistor. In this example, if the transistor M1 is turned on and the transistor M2 is not turned on, the transistor M1 operates in a saturation (or linear) region and the transistor M2 operates in a cut-off region. Accordingly, the capacitance value of the parasitic capacitor $C_{GD1}$ is equal to or higher than that of the parasitic capacitor $C_{GD2}$.

Similarly, with reference to the relevant analysis of parasitic capacitor of transistors in the document, it can be understood that a capacitance value of a parasitic capacitor between gate and source (e.g., the parasitic capacitor $C_{GS3}$ or $C_{GS4}$) is associated with a gate-source voltage. As mentioned above, the current generated from the current source circuit 142 (or the current source circuit 141) may be set to be lower than the current generated from the transistor M3. Under a condition that the transistor M2 is not turned on, a current flowing through the transistor M4 (i.e., which is a current provided from the current source circuit 142 only) is lower than the current flowing through the transistor M3 (which includes the current provided from the current source circuit 141 and the current provided from the transistor M1). Under this condition, it can be derived that the gate-source voltage of the transistor M3 is higher than that of the transistor M4. Accordingly, it can be derived that the capacitance value of the parasitic capacitor $C_{GS3}$ is higher than that of the parasitic capacitor $C_{GS4}$.

Accordingly, under the condition that the transistor M1 is turned on, the transistor M2 is not turned on, and the switched-capacitor circuit 160 is not employed, it can be derived that the capacitance value of the capacitor $C_A$ is higher than that of the capacitor $C_B$. As shown in FIG. 1B, the output impedance Z+ includes the impedance of the capacitor $C_A$ and the impedance of the output impedance Z− includes the capacitor $C_B$, and the impedance of the capacitor $C_A$ and that of the capacitor $C_B$ are varied with frequency. In other words, the output impedance Z+ and the output impedance Z− are frequency-dependent impedances. In this example, as the capacitance value of the capacitor $C_A$ is higher than that of the capacitor $C_B$, when the circuit in FIG. 1B operates at high frequencies, the impedance of the capacitor $C_A$ is different from that of the capacitor $C_B$. As a result, the value of the output impedance Z+ is not identical to that of the output impedance Z−, which results in a lower linearity.

In order to improve such problem, the switched-capacitor circuit 160 in FIG. 1A may provide the capacitor C2 to the node N2 when the transistor M2 is turned off, in order to increase the capacitance value of the node N2 (i.e., increase the capacitance value of the capacitor $C_B$). With the above operations, the capacitance value of the capacitor $C_B$ can be calibrated to be close to (or identical to) that of the capacitor $C_A$. As a result, when the digital to analog converter circuit 100 in FIG. 1A operates at high frequencies, the output impedance Z− may be matched with the output impedance Z− as much as possible, in order to increase the linearity of the digital to analog converter circuit 100. With this analogy, when the transistor M1 is turned off, the switched-capacitor circuit 160 may provide the capacitor C1 to the node N1, in order to increase the capacitance value of the node N1 (i.e., increase the capacitance value of the capacitor $C_A$).

Figure 2:
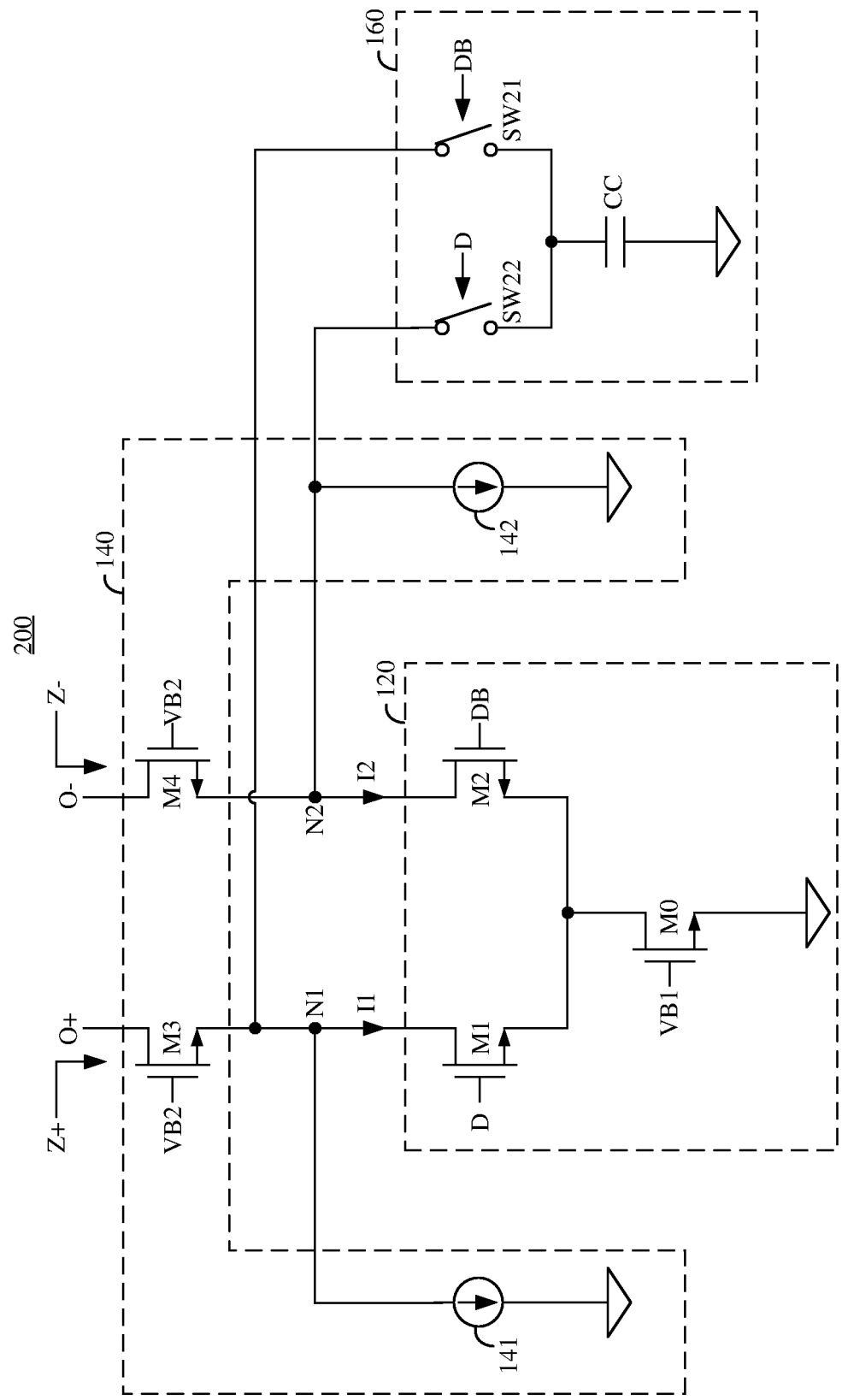
FIG. 2 shows a schematic diagram of a digital to analog converter circuit according to some embodiments of the present disclosure.

FIG. 2 shows a schematic diagram of a digital to analog converter circuit 200 according to some embodiments of the present disclosure. Compared with FIG. 1A, in examples of FIG. 2, the switched-capacitor circuit 160 may couple a capacitor (e.g., capacitor CC) to a corresponding one of the node N1 and the node N2 according to the bit D and the bit DB.

In greater detail, the switched-capacitor circuit 160 includes a capacitor CC, a switch SW21, and a switch SW22. A terminal of the capacitor CC is coupled to the switch SW21 and the switch SW22, and another terminal of the capacitor CC is coupled to ground. The switch SW21 is configured to be selectively turned on according to the bit DB, in order to couple the capacitor CC to the node N1. The switch SW22 is configured to be selectively turned on according to the bit D, in order to couple the capacitor CC to the node N2.

The arrangements of the switched-capacitor circuit 160 in FIG. 1A or 2 are given for illustrative purpose, and the present disclosure is not limited thereto. Various arrangements able to compensate capacitance values are within the contemplated scope of the present disclosure.

Figure 3A:
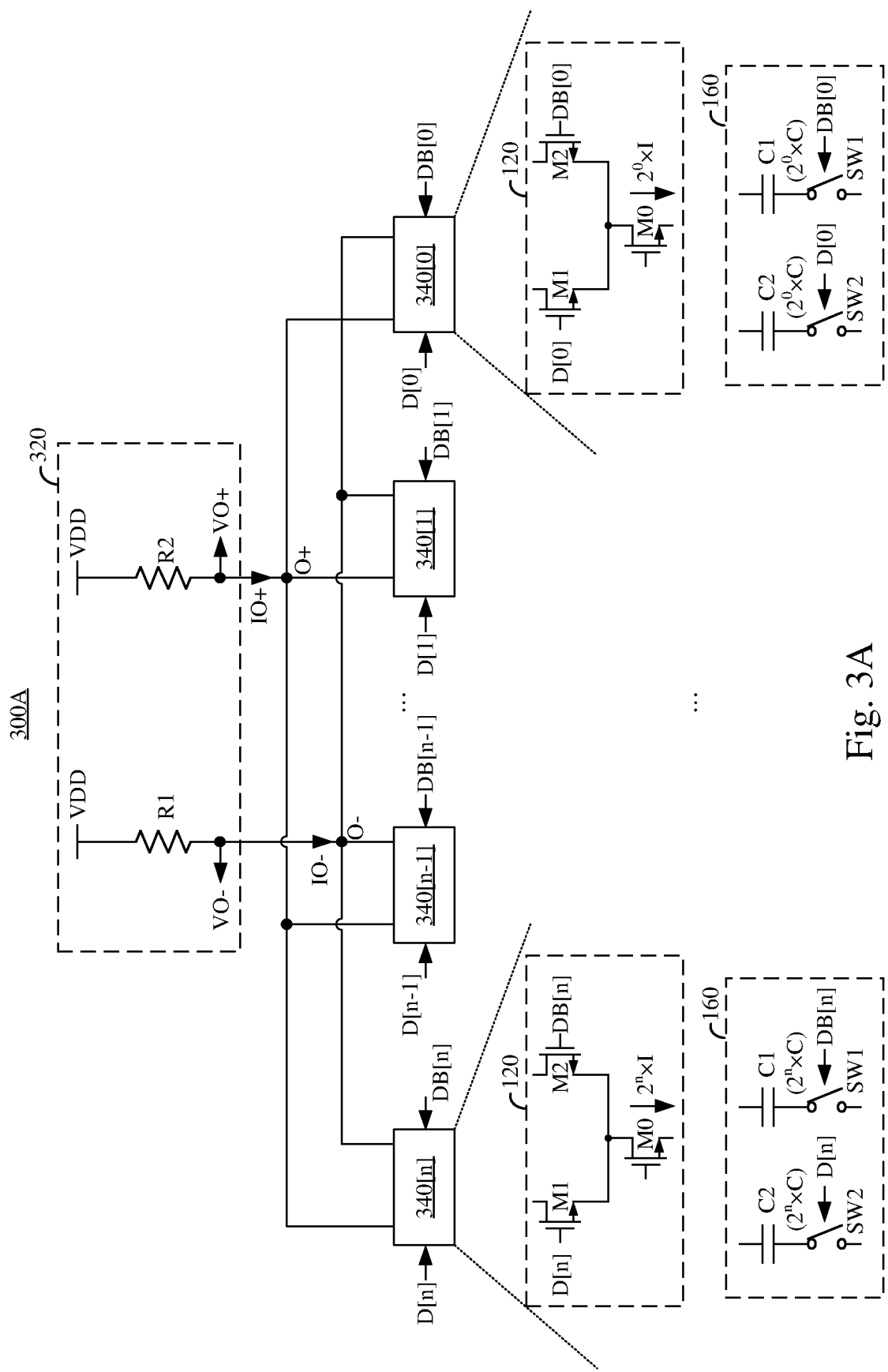
FIG. 3A shows a schematic diagram of a current steering digital to analog converter according to some embodiments of the present disclosure.

FIG. 3A shows a schematic diagram of a current steering digital to analog converter 300A according to some embodiments of the present disclosure. In this example, the current steering digital to analog converter 300A includes a load circuit 320 and digital to analog converter circuits 340[0]-340[n].

The load circuit 320 is coupled to the output terminal O+ and the output terminal O−, and is configured to convert a current IO+ to be an output signal VO+, and convert a current IO− to be an output signal VO−. For example, the load circuit 320 includes a resistor R1 and a resistor R2. A terminal of the resistor R1 receives a voltage VDD, and another terminal of the resistor R1 is configured to generate the output signal VO−. A terminal of the resistor R2 receives the voltage VDD, and another terminal of the resistor R2 is configured to generate the output signal VO+.

The digital to analog converter circuits 340[0]-340[n] generate the current IO+ and the current IO− according to bits D[0]-D[n] and bits DB[0]-DB[n]. In this example, each of the digital to analog converter circuits 340[0]-340[n] may be implemented with the digital to analog converter circuit 100 in FIG. 1A. For ease of illustration, FIG. 3A only shows the corresponding arrangements of part circuits in the digital to analog converter circuit 100, the detailed arrangements and operations thereof can be understood with reference to FIG. 1A, and thus the repetitious descriptions are not further given.

Taking the digital to analog converter circuit 340[n] as an example, in the digital to analog converter circuit 340[n], the transistor M1 receives the bit D[n], and the transistor M2 receives the bit DB[n], in which the bit D[n] and the bit DB[n] have opposite logic values. The transistor M1 is selectively turned on according to the bit D[n] to generate a signal component (e.g., the current I1 in FIG. 1A) in the current IO+, and the transistor M2 is selectively turned on according to the bit DB[n] to generate a signal component (e.g., the current I2 in FIG. 1A) in the current IO−. According to a binary weight corresponding to the bit D[n] (i.e., the value n which may be an integer high than or equal to 0), the transistor M0 is configured to provide a current $2^n \times I$ (I is a unity-current). Correspondingly, in the digital to analog converter circuit 340[n], the capacitance value of each of the capacitor C1 and the capacitor C2 is $2^n \times C$ (C is a unity-capacitor), the switch SW1 is selectively turned on according to the bit DB[n], and the switch SW2 is selectively turned on according to the bit D[n]. With this analogy, in the digital to analog converter circuit 340[0], the transistor M1 is selectively turned on according to the bit D[0] to generate another signal component (e.g., the current I1 in FIG. 1A) in the current IO+, and the transistor M2 is selectively turned on according to the bit DB[0] to generate another signal component in (e.g., the current I2 in FIG. 1A) in the current IO−, in which the bit D[0] and the bit DB[0] have opposite logic values. According to the binary weight corresponding to the bit D[0], the transistor M0 is configured to provide a current $2^0 \times I$. Correspondingly, in the digital to analog converter circuit 340[0], the capacitance value of each of the capacitor C1 and the capacitor C2 is $2^0 \times C$, the switch SW1 is selectively turned on according to the bit DB[0], and the switch SW2 is selectively turned on according to the bit D[0]. It should be understood that, the current provided from the transistor M0 and the capacitance value of the capacitor C1 (and the capacitor C2) are proportional to a weight corresponding to the received bit D[n].

Figure 3B:
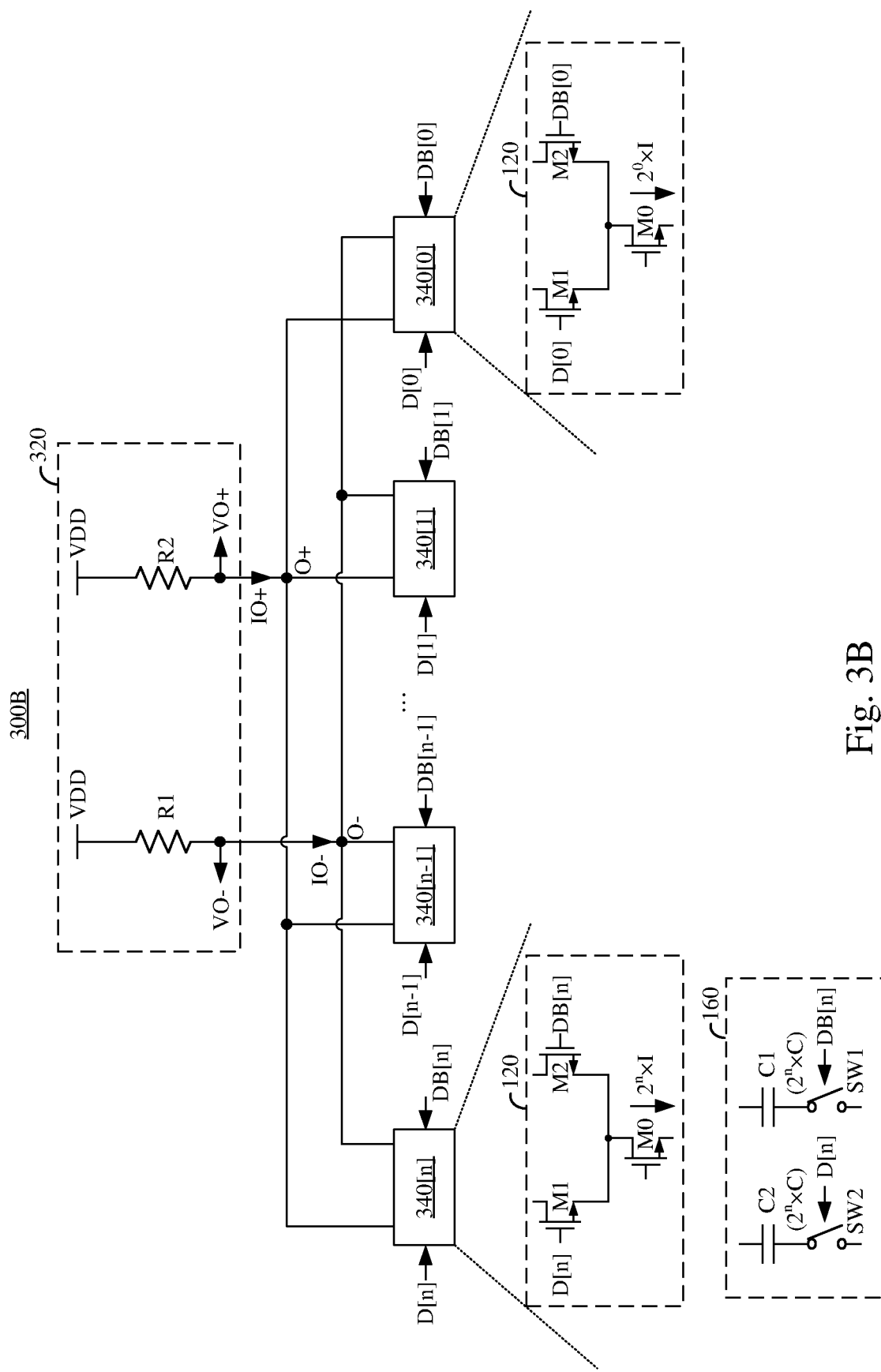
FIG. 3B shows a schematic diagram a current steering digital to analog converter according to some embodiments of the present disclosure.

FIG. 3B shows a schematic diagram a current steering digital to analog converter 300B according to some embodiments of the present disclosure. Compared with FIG. 3A, in this example, at least one, which corresponds to high-weight bit(s) (e.g., the most significant bit D[n]), of the digital to analog converter circuits 340[0]-340[n] can be implemented with the digital to analog converter circuit 100 in FIG. 1A.

For example, the digital to analog converter circuit 340[n] for processing the most significant bit D[n] may be implemented with the digital to analog converter circuit 100 in FIG. 1A, and the detailed arrangement thereof is similar to the arrangements shown in FIG. 1A and FIG. 3A, and thus the repetitious descriptions are not further given. The remaining circuits in the digital to analog converter circuits 340[0]-340[n] may not employ the switched-capacitor circuit 160. For example, the digital to analog converter circuit 340[0] may operate without employing the switched-capacitor circuit 160. By improving the switching impedance of the digital to analog converter circuit 340[n] which is configured to process the high-weigh bit, the linearity of the current steering digital to analog converter 300B can be improved as well.

Figure 4A:
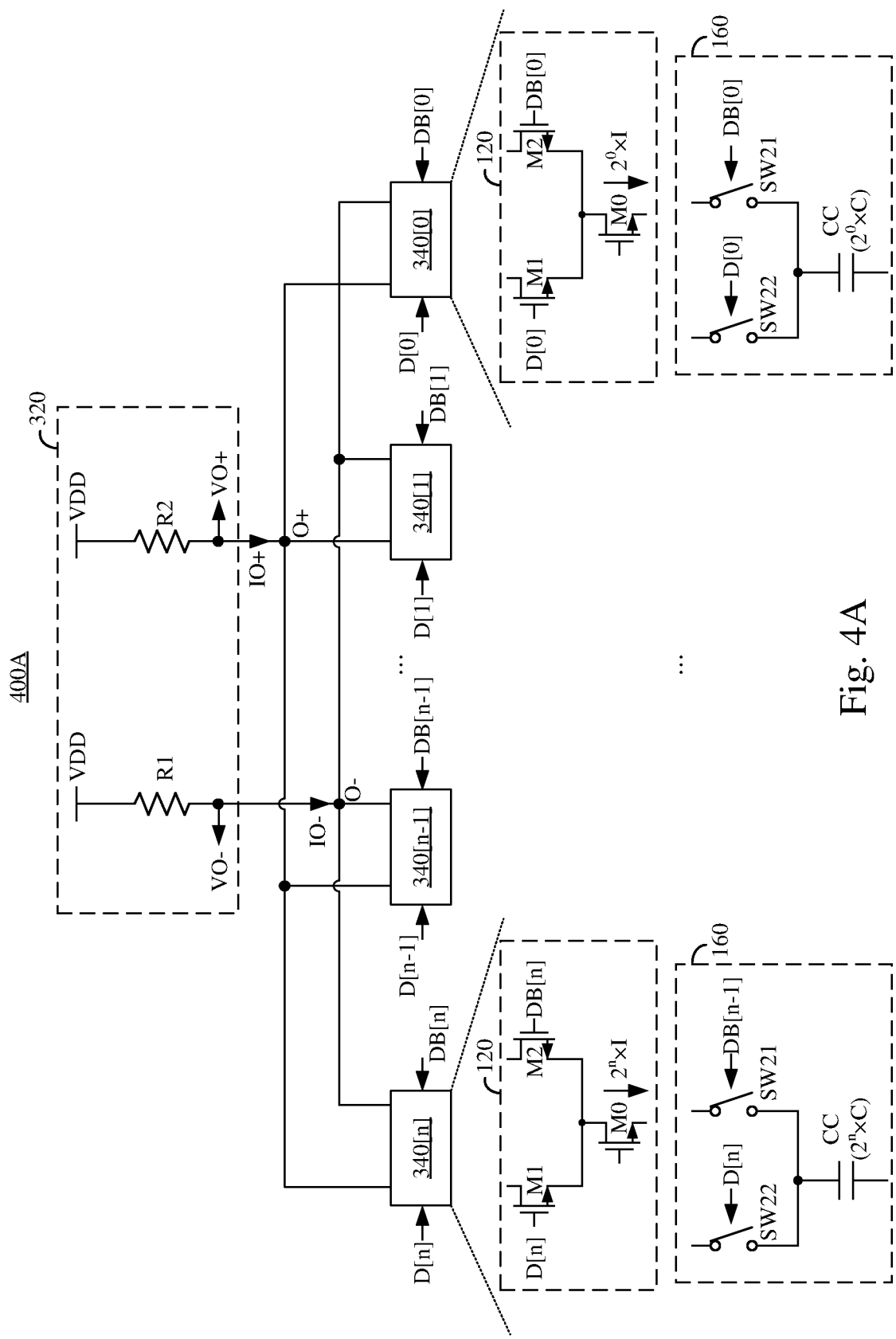
FIG. 4A shows a schematic diagram of a current steering digital to analog converter according to some embodiments of the present disclosure.

FIG. 4A shows a schematic diagram of a current steering digital to analog converter 400A according to some embodiments of the present disclosure. In this example, the current steering digital to analog converter 400A includes the load circuit 320 and the digital to analog converter circuits 340[0]-340[n].

Compared with FIG. 3A, in this example, each of the digital to analog converter circuits 340[0]-340[n] may be implemented with the digital to analog converter circuit 200 in FIG. 2. For ease of illustration, FIG. 4A only shows the corresponding arrangements of part circuits in the digital to analog converter circuit 200, the detailed arrangements and operations thereof can be understood with reference to FIG. 2, and thus the repetitious descriptions are not further given.

Taking the digital to analog converter circuit 340[n] as an example, in the digital to analog converter circuit 340[n], the transistor M1 receives the bit D[n], and the transistor M2 receives the bit DB[n]. The transistor M1 is selectively turned on according to the bit D[n] to generate a signal component (e.g., the current I1 in FIG. 2) of the current IO+, and the transistor M2 is selectively turned on according to the bit DB[n] to generate a signal component (e.g., the current I2 in FIG. 2) of the current IO−. According to the binary weight corresponding to the bit D[n], the transistor M0 is configured to provide a current $2^n \times I$. Correspondingly, in the digital to analog converter circuit 340[n], the capacitance value of the capacitor CC is $2^n \times C$ (C is a unity-capacitor), the switch SW21 is selectively turned on according to the bit DB[n], and the switch SW22 is selectively turned on according to the bit D[n]. With this analogy, in the digital to analog converter circuit 340[0], the transistor M1 is selectively turned on according to the bit D[0] to generate another signal component (e.g., the current I1 in FIG. 2) of the current IO+, and the transistor M2 is selectively turned on according to the bit DB[0] to generate another signal component (e.g., the current I2 in FIG. 2) of the current IO−. According to the binary weight corresponding to the bit D[0], the transistor M0 is configured to provide a current $2^0 \times I$. Correspondingly, in the digital to analog converter circuit 340[0], the capacitance value of the capacitor CC is $2^0 \times C$, the switch SW21 is selectively turned on according to the bit DB[0], and the switch SW22 is selectively turned on according to the bit D[0] is selectively turned on. It should be understood that, the current provided from the transistor M0 and the capacitance value of the capacitor CC are proportional to the weight corresponding to the received bit D[n].

Figure 4B:
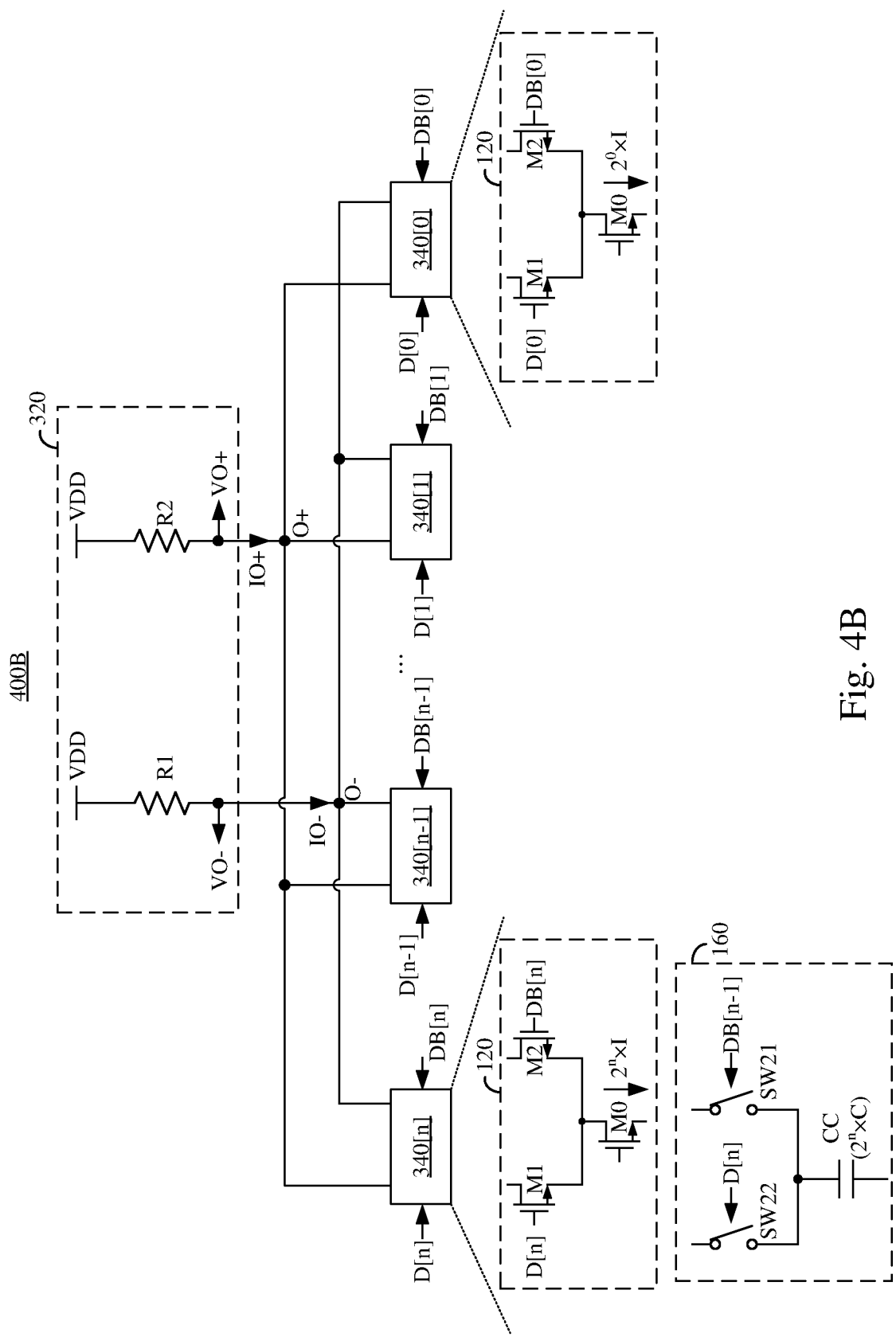
FIG. 4B shows a schematic diagram of a current steering digital to analog converter according to some embodiments of the present disclosure.

FIG. 4B shows a schematic diagram of a current steering digital to analog converter 400B according to some embodiments of the present disclosure. Compared with FIG. 4A, in this example, at least one, which corresponds to the high-weight bit(s) (e.g., the most significant bit D[n]), of the digital to analog converter circuits 340[0]-340[n] may be implemented with the digital to analog converter circuit 200 in FIG. 2.

For example, the digital to analog converter circuit 340[n] for processing the most significant bit D[n] may be implemented with the digital to analog converter circuit 200, and the circuit arrangement thereof is similar to the arrangements shown in FIG. 2 and FIG. 4A, and thus the repetitious descriptions are not further given. The remaining circuits in the digital to analog converter circuits 340[0]-340[n] may not employ the switched-capacitor circuit 160. For example, the digital to analog converter circuit 340[0] may operate without employing the switched-capacitor circuit 160. By improving the switching impedance of the digital to analog converter circuit 340[n] for processing the high-weight bit, the linearity of the current steering digital to analog converter 400B can be improved as well.

In other words, in different embodiments, a portion of circuits (e.g., a circuit portion that processes most significant bit(s)) in the digital to analog converter circuits 340[0]-340[n] may be implemented with the digital to analog converter circuit 100 in FIG. 1A or the digital to analog converter circuit 200 in FIG. 2, and the remaining circuits in the digital to analog converter circuits 340[0]-340[n] may be implemented with a digital to analog converter circuit that does not employ the switched-capacitor circuit 160.

The examples in FIG. 3A to FIG. 4B are given with reference to a binary weight scheme, but the present disclosure is not limited thereto. In other embodiments, the digital to analog converter circuits in the above examples may be implemented with other coding scheme (e.g., thermometer (unary) code scheme, unary-binary segmentation scheme, or the like).

In some other embodiments, the digital to analog converter circuit 100 in FIG. 1A or the digital to analog converter circuit 200 in FIG. 2 may operate without employing the impedance adjustment circuit 140. In those embodiments, the output terminal O+ may be directly coupled to the node N1, the output terminal O− may be directly coupled to the node N2, and the switched-capacitor circuit 160 is configured to lower the impacts from parasitic capacitors of the transistor M1 and the transistor M2 (e.g., the parasitic capacitors $C_{GD1}$ and $C_{GD2}$).

The corresponding relation among the number of circuits, the number of the bits, and the high-weight bits in the above examples are given for illustrative purposes, and the present disclosure is not limited thereto. According to requirements of practical applications, the corresponding relation among the number of circuits, the number of the bits, and the high-weight bits in the above examples can be adjusted correspondingly.

In some embodiments, the above transistors or switches may be N-type transistors. In some embodiments, the above transistors or switches may be implemented with metal oxide semiconductor field effect transistors, but the present disclosure is not limited thereto. Various conductivity types (P type or N type) of transistors and various kinds of transistors able to implement similar operations are within the contemplated scope of the present disclosure.

As described above, the digital to analog converter circuit and the digital to analog converter provided in some embodiments of the present disclosure are able to increase the switching impedance of the digital to analog converter circuit, in order to improve the linearity of the digital to analog converter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A digital to analog converter circuit, comprising:
    an input circuit configured to selectively drain a first current from a first node or drain a second current from a second node according to a first bit and a second bit, wherein the first bit and the second bit have opposite logic values;
    a switched-capacitor circuit configured to selectively compensate a capacitance value of one of the first node and the second node according to the first bit and the second bit; and
    an impedance adjustment circuit configured to transmit the first current from a first output terminal to the first node or transmit the second current from a second output terminal to the second node, and increase an output impedance of each of the first output terminal and the second output terminal.

2. The digital to analog converter circuit of claim 1, wherein the switched-capacitor circuit is configured to increase the capacitance value of the first node according to the second bit, and increase the capacitance value of the second node according to the first bit.

3. The digital to analog converter circuit of claim 1, wherein the switched-capacitor circuit is configured to selectively couple a first capacitor to the first node according to the second bit, and selectively couple a second capacitor to the second node according to the first bit.

4. The digital to analog converter circuit of claim 1, wherein the switched-capacitor circuit is configured to selectively couple a capacitor to a corresponding one of the first node and the second node according to the first bit and the second bit.

5. The digital to analog converter circuit of claim 1, wherein the switched-capacitor circuit comprises:
    a first capacitor coupled to the first node;
    a second capacitor coupled to the second node;
    a first switch configured to be selectively turned on according to the second bit, in order to be coupled to ground via the first capacitor; and
    a second switch configured to be selectively turned on according to the first bit, in order to be coupled to ground via the second capacitor.

6. The digital to analog converter circuit of claim 1, wherein the switched-capacitor circuit comprises:
    a capacitor;
    a first switch configured to be selectively turned on according to the second bit, in order to couple the capacitor to the first node; and
    a second switch configured to be selectively turned on according to the first bit, in order to couple the capacitor to the second node.

7. The digital to analog converter circuit of claim 1, wherein the input circuit comprises:
    a first transistor coupled to the first node and configured to be selectively turned on according to the first bit; and
    a second transistor coupled to the second node and configured to be selectively turned on according to the second bit,
    wherein the switched-capacitor circuit is configured to increase the capacitance value of the first node when the first transistor is not turned on, and increase the capacitance value of the second node when the second transistor is not turned on.

8. The digital to analog converter circuit of claim 1, wherein the impedance adjustment circuit comprises:
a third transistor coupled to the first node and configured to be turned on according to a voltage;
a first current source circuit coupled to the first node and configured to keep a work region of the third transistor;
a fourth transistor coupled to the second node and configured to be turned on according to the voltage; and
a second current source circuit coupled to the second node and configured to keep a work region of the fourth transistor.

9. The digital to analog converter circuit of claim 1, wherein the switched-capacitor circuit is configured to selectively compensate the capacitance value of the one of the first node and the second node to match the output impedance of the first output terminal with and the output impedance of the second output terminal.

10. A current steering digital to analog converter, comprising:
a load circuit configured to convert a first current into a first output signal and convert a second current into a second output signal; and
a plurality of digital to analog converter circuits configured to drain the first current and the second current according to a plurality of bits, wherein one of the plurality of digital to analog converter circuits comprises:
an input circuit configured to drain a signal component in the first current from a first node or drain a signal component in the second current from a second node according to a first bit and a second bit in the plurality of bits, wherein the first bit is a most significant bit in the plurality of bits, and the first bit and the second bit have opposite logic values; and
a switched-capacitor circuit configured to selectively compensate a capacitance value of each of the first node and the second node.

11. The current steering digital to analog converter of claim 10, wherein the capacitance value is proportional to a weight corresponding to the first bit.

12. The current steering digital to analog converter of claim 10, wherein the switched-capacitor circuit is configured to increase the capacitance value of the first node according to the second bit, and increase the capacitance value of the second node according to the first bit.

13. The current steering digital to analog converter of claim 10, wherein the switched-capacitor circuit is configured to selectively couple a first capacitor to the first node according to the second bit, and selectively couple a second capacitor to the second node according to the first bit.

14. The current steering digital to analog converter of claim 10, wherein the switched-capacitor circuit is configured to selectively couple a capacitor to a corresponding one of the first node and the second node according to the first bit and the second bit.

15. The current steering digital to analog converter of claim 10, wherein the switched-capacitor circuit comprises:
a first capacitor coupled to the first node;
a second capacitor coupled to the second node;
a first switch configured to be selectively turned on according to the second bit, in order to be coupled to ground via the first capacitor; and
a second switch configured to be selectively turned on according to the first bit, in order to be coupled to ground via the second capacitor.

16. The current steering digital to analog converter of claim 10, wherein the switched-capacitor circuit comprises:
a capacitor;
a first switch configured to be selectively turned on according to the second bit, in order to couple the capacitor to the first node; and
a second switch configured to be selectively turned on according to the first bit, in order to couple the capacitor to the second node.

17. The current steering digital to analog converter of claim 10, wherein the input circuit comprises:
a first transistor coupled to the first node and configured to be selectively turned on according to the first bit; and
a second transistor coupled to the second node and configured to be selectively turned on according to the second bit,
wherein the switched-capacitor circuit is configured to increase the capacitance value of the first node when the first transistor is not turned on, and increase the capacitance value of the second node when the second transistor is not turned on.

18. The current steering digital to analog converter of claim 10, wherein the one of the plurality of digital to analog converter circuits further comprises:
an impedance adjustment circuit configured to transmit the first current from a first output terminal to the first node or transmit the second current from a second output terminal to the second node, and increase an output impedance of each of the first output terminal and the second output terminal.

19. The current steering digital to analog converter of claim 18, wherein the impedance adjustment circuit comprises:
a third transistor coupled to the first node and configured to be turned on according to a voltage;
a first current source circuit coupled to the first node and configured to keep a work region of the third transistor;
a fourth transistor coupled to the second node and configured to be turned on according to the voltage; and
a second current source circuit coupled to the second node and configured to keep a work region of the fourth transistor.

* * * * *

UNITED STATES PATENT AND TRADEMARK OFFICE
CERTIFICATE OF CORRECTION

| | | |
|---|---|---|
| PATENT NO. | : 12,040,809 B2 | Page 1 of 1 |
| APPLICATION NO. | : 17/730248 | |
| DATED | : July 16, 2024 | |
| INVENTOR(S) | : Xiao-Bo Zhou | |

It is certified that error appears in the above-identified patent and that said Letters Patent is hereby corrected as shown below:

On the Title Page

Inventor's address should be listed as the following:
(72) Inventor: Xiao-Bo Zhou, Suzhou (CN)

Signed and Sealed this
First Day of October, 2024

Katherine Kelly Vidal
*Director of the United States Patent and Trademark Office*